(12) United States Patent
Yamazaki et al.

(10) Patent No.: US 7,977,876 B2
(45) Date of Patent: Jul. 12, 2011

(54) LIGHT EMITTING DEVICE AND METHOD OF MANUFACTURING THE SAME

(75) Inventors: Shunpei Yamazaki, Tokyo (JP); Toshimitsu Konuma, Kanagawa (JP); Takeshi Nishi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/526,345

(22) Filed: Sep. 25, 2006

(65) Prior Publication Data

US 2007/0018566 A1    Jan. 25, 2007

Related U.S. Application Data

(62) Division of application No. 09/707,862, filed on Nov. 7, 2000, now Pat. No. 7,112,115.

(30) Foreign Application Priority Data

Nov. 9, 1999    (JP) .................................... 11-318252

(51) Int. Cl.
*H01L 51/00* (2006.01)
*H05B 33/04* (2006.01)

(52) U.S. Cl. ........................................ 313/512; 313/504
(58) Field of Classification Search .............. 313/512, 313/504, 506

See application file for complete search history.

(56) References Cited

U.S. PATENT DOCUMENTS

| | | | |
|---|---|---|---|
| 4,599,538 A | 7/1986 | Hidler et al. | |
| 5,107,175 A | 4/1992 | Hirano et al. | |
| 5,124,204 A | 6/1992 | Yamashita et al. | |
| 5,169,693 A * | 12/1992 | Fujimura | 349/154 |
| 5,189,405 A | 2/1993 | Yamashita et al. | |
| 5,632,663 A | 5/1997 | Ishihara et al. | |
| 5,684,365 A | 11/1997 | Tang et al. | |
| 5,686,360 A | 11/1997 | Harvey, III et al. | |
| 5,693,956 A | 12/1997 | Shi et al. | |
| 5,757,126 A | 5/1998 | Harvey, III et al. | |
| 5,771,562 A | 6/1998 | Harvey, III et al. | |
| 5,811,177 A | 9/1998 | Shi et al. | |
| 5,864,206 A | 1/1999 | Ishihara et al. | |
| 5,882,949 A | 3/1999 | Okazaki | |
| 5,909,081 A | 6/1999 | Eida et al. | |
| 5,952,778 A | 9/1999 | Haskal et al. | |
| 5,962,962 A | 10/1999 | Fujita et al. | |
| 5,990,615 A | 11/1999 | Sakaguchi et al. | |
| 5,990,629 A | 11/1999 | Yamada et al. | |
| 6,046,543 A | 4/2000 | Bulovic et al. | |
| 6,099,672 A * | 8/2000 | Yamazaki et al. | 156/109 |
| 6,111,355 A * | 8/2000 | Inoue et al. | 313/506 |
| 6,121,726 A | 9/2000 | Codama et al. | |

(Continued)

FOREIGN PATENT DOCUMENTS

EP    0 999 595    5/2000

(Continued)

*Primary Examiner* — Karabi Guharay
(74) *Attorney, Agent, or Firm* — Husch Blackwell LLP

(57) ABSTRACT

Technology to reduce the manufacturing cost of a manufacturing process of a light emitting device is provided. The manufacturing cost of a device using a light emitting element can be reduced by using a multilayout process for forming a plurality of light emitting devices from a large-sized substrate. In particular, an existing line for manufacturing liquid crystal cells can be diverted to a process of encapsulating light emitting elements, which can greatly reduce the manufacturing cost including the investment in plant and equipment.

36 Claims, 9 Drawing Sheets

U.S. PATENT DOCUMENTS

| | | | |
|---|---|---|---|
| 6,146,225 A | 11/2000 | Sheats et al. | |
| 6,150,187 A | 11/2000 | Zyung et al. | |
| 6,160,346 A | 12/2000 | Vleggaar et al. | |
| 6,172,459 B1 | 1/2001 | Hung et al. | |
| 6,195,142 B1 | 2/2001 | Gyotoku et al. | |
| 6,198,217 B1 | 3/2001 | Suzuki et al. | |
| 6,198,220 B1 | 3/2001 | Jones et al. | |
| 6,219,127 B1 * | 4/2001 | Hirakata et al. | 349/153 |
| 6,236,444 B1 * | 5/2001 | Konuma et al. | 349/151 |
| 6,239,470 B1 | 5/2001 | Yamazaki | |
| 6,274,887 B1 | 8/2001 | Yamazaki et al. | |
| 6,345,903 B1 | 2/2002 | Koike et al. | |
| 6,388,652 B1 | 5/2002 | Yamazaki et al. | |
| 6,413,645 B1 | 7/2002 | Graff et al. | |
| 6,441,468 B1 | 8/2002 | Yamazaki | |
| 6,525,339 B2 | 2/2003 | Motomatsu | |
| 6,545,359 B1 * | 4/2003 | Ohtani et al. | 257/758 |
| 6,580,094 B1 * | 6/2003 | Yamazaki et al. | 257/79 |
| 6,605,826 B2 | 8/2003 | Yamazaki et al. | |
| 6,612,888 B1 | 9/2003 | Pai et al. | |
| 6,710,542 B2 | 3/2004 | Chun et al. | |
| 6,720,203 B2 | 4/2004 | Carcia et al. | |
| 6,737,753 B2 | 5/2004 | Kumar et al. | |
| 6,777,621 B2 | 8/2004 | Ishikawa et al. | |
| 6,778,164 B2 | 8/2004 | Yamazaki et al. | |
| 6,803,127 B2 | 10/2004 | Su et al. | |
| 6,806,638 B2 | 10/2004 | Lih et al. | |
| 6,819,044 B2 | 11/2004 | Shirakawa et al. | |
| 6,825,612 B2 | 11/2004 | Lai | |
| 6,831,298 B2 | 12/2004 | Park et al. | |
| 6,833,668 B1 | 12/2004 | Yamada et al. | |
| 6,835,950 B2 | 12/2004 | Brown et al. | |
| 6,863,961 B2 * | 3/2005 | Miyashita et al. | 428/203 |
| 6,924,594 B2 | 8/2005 | Ogura et al. | |
| 7,256,776 B2 | 8/2007 | Yamazaki et al. | |
| 7,279,711 B1 * | 10/2007 | Yamazaki et al. | 257/69 |
| 2002/0070663 A1 | 6/2002 | Ogura et al. | |
| 2002/0125817 A1 | 9/2002 | Yamazaki et al. | |
| 2003/0218422 A1 | 11/2003 | Park et al. | |
| 2007/0291022 A1 | 12/2007 | Yamazaki et al. | |

FOREIGN PATENT DOCUMENTS

| | | |
|---|---|---|
| EP | 1 058 314 | 12/2000 |
| EP | 1 058 484 | 12/2000 |
| JP | 62-299890 | 12/1987 |
| JP | 5-38677 | 2/1993 |
| JP | 7-254486 | 10/1995 |
| JP | 7-320866 | 12/1995 |
| JP | 09-035868 | 2/1997 |
| JP | 11-44869 | 2/1999 |
| JP | 11-054285 | 2/1999 |
| JP | 11-65471 | 3/1999 |
| JP | 11-162635 | 6/1999 |
| JP | 11-185956 | 7/1999 |
| JP | 11-307257 | 11/1999 |
| JP | 2000-252473 | 9/2000 |
| JP | 2001-297878 A | 10/2001 |

* cited by examiner

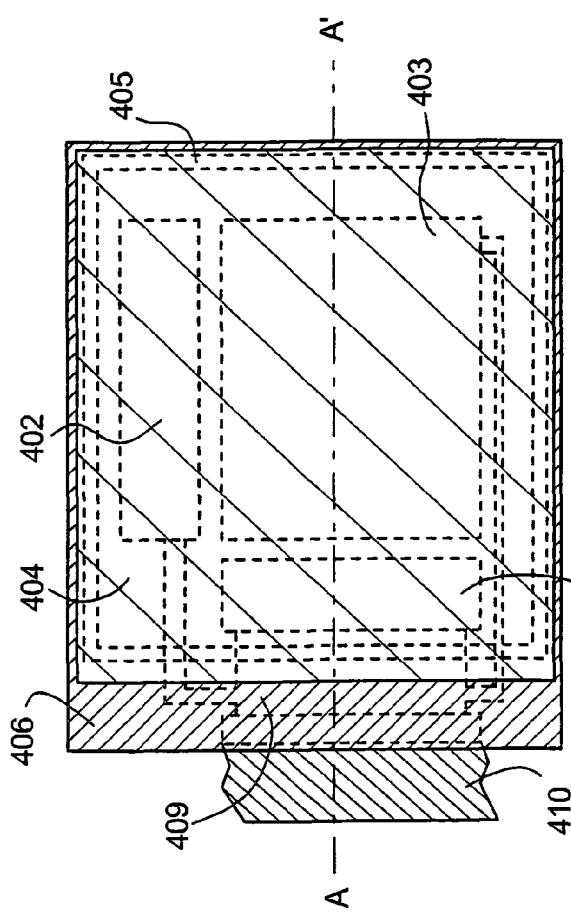
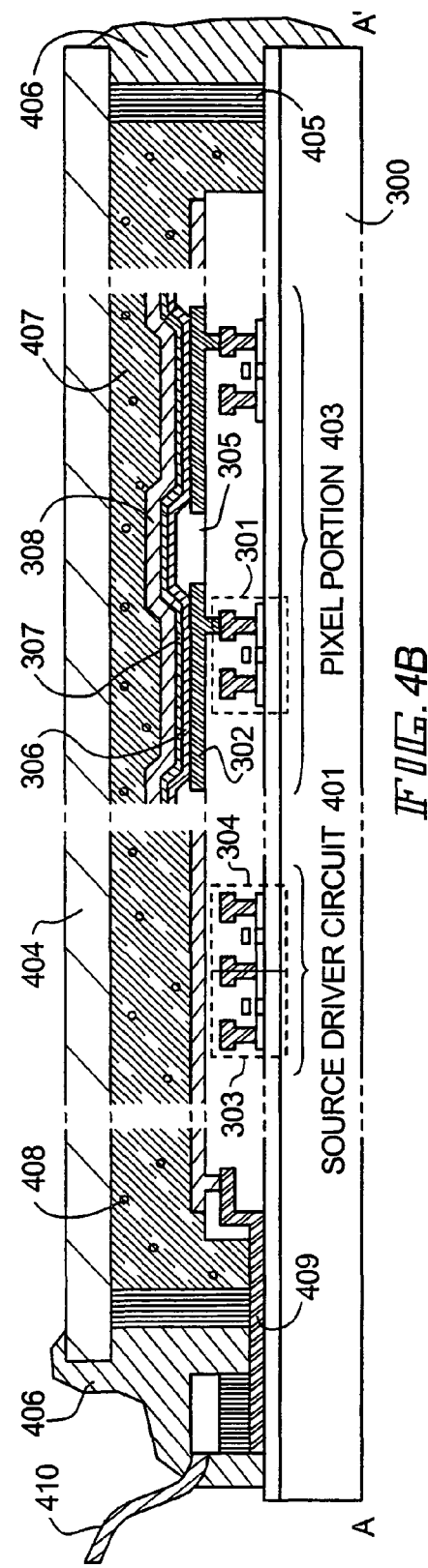

LIGHT EMITTING DEVICE AND METHOD OF MANUFACTURING THE SAME

This application is a divisional of U.S. application Ser. No. 09/707,862, filed on Nov. 7, 2000 now U.S. Pat. No. 7,112,115.

BACKGROUND OF THE INVENTION

1. Field of the Invention

The present invention relates to a light emitting device having an element in which a light emitting material is sandwiched between electrodes (hereinafter referred to as light emitting element), and to a method of manufacturing the same. More particularly, the present invention relates to a light emitting device using a light emitting material with which EL (electro luminescence) can be obtained (hereinafter referred to as EL material).

2. Description of the Related Art

In recent years, a light emitting device (hereinafter referred to as EL display device) using light emitting elements utilizing an EL phenomenon of a light emitting material (hereinafter referred to as EL element) has been advancing. The light emitting element of an EL display device itself can emit light. Accordingly, differently from a liquid crystal display, no back light is necessary. Further, since the viewing angle thereof is wide, the EL display devices are suitable for outdoor uses.

Light emitting materials that can be used for an EL element include inorganic materials and organic materials. In recent years, organic materials which can be driven with low driving voltage, have been attracting attention. However, when the organic material is used for the EL element, there is a problem in that deterioration thereof develops rapidly. Since the organic material is oxidized, the efficiency of recombination of carriers becomes extremely worse, and thus, the EL phenomenon can not be obtained.

For the purpose of preventing the deterioration of the organic material used for an EL element, various ideas have been attempted. Generally, a method is known in which an EL element is covered with a ceramic material or a metal material to seal up the EL element in a space to shut out the outside air. EL displays manufactured by Tohoku Pioneer Co., Ltd. employ this method. Tohoku Pioneer Co., Ltd. provides a drying agent in the space.

Further, as the other means, technology disclosed in Japanese Patent Application Laid-open Nos. Hei 9-35868 and 11-54285 are known.

SUMMARY OF THE INVENTION

The present invention has been made in view of the above, and therefore has an object thereof to improve the throughput and the yield in a method of encapsulating a light emitting element for protecting it against the outside air, and to reduce the manufacturing cost of a light emitting device using the light emitting element.

According to the present invention, by using a multilayout process for forming a plurality of light emitting devices from a large-sized substrate, the manufacturing cost of a light emitting device using a light emitting element may be reduced. In particular, the most remarkable feature of the present invention is to make it possible to divert an existing line for manufacturing liquid crystal cells to the process of encapsulating light emitting elements according to the present invention, which can greatly reduce the manufacturing cost including the investment in plant and equipment.

The present invention has an advantage in that, by employing the process of encapsulating light emitting elements similar to that of forming liquid crystal cells, existing apparatus used in a process of forming cells can be diverted to apparatus used in that of encapsulating light emitting elements with small modifications. Further, since the process of forming liquid crystal cells has already gotten enough results of mass production, its diversion greatly improves the yield thereof.

More specifically, by forming a sealing material on an insulator (such as a substrate) having a light emitting element formed thereon and bonding a covering material thereto using the sealing material, a portion surrounded by the insulator, the covering material, and the sealing material is made to be a space which can be sealed off (hereinafter referred to as cell), and the cell is filled with resin or liquid. Such resin or liquid used for this purpose is herein referred to as encapsulant (or filler). It is characterized in that the encapsulant is filled using vacuum injection. The resin may be injected into the cell when it is on the liquid phase and may be cured thereafter.

It is to be noted that a light emitting device using an EL element herein described includes a light emitting device for displaying character information or image information (hereinafter referred to as EL display device) and a light emitting device used as a light source (hereinafter referred to as EL light emitting device).

BRIEF DESCRIPTION OF THE DRAWINGS

In the accompanying drawings:

FIGS. 4A and 4B illustrate the structure of an upper surface and a sectional structure of an EL display device;

DETAILED DESCRIPTION OF THE PREFERRED EMBODIMENTS

A case where a plurality of active matrix EL display devices are manufactured on a large-sized substrate according to the present invention is now described. Reference is made to plan views of FIGS. 1A-3B. It is to be noted that the plan views are accompanied with sectional views taken along the lines A-A' and B-B', respectively.

Figure 1A:
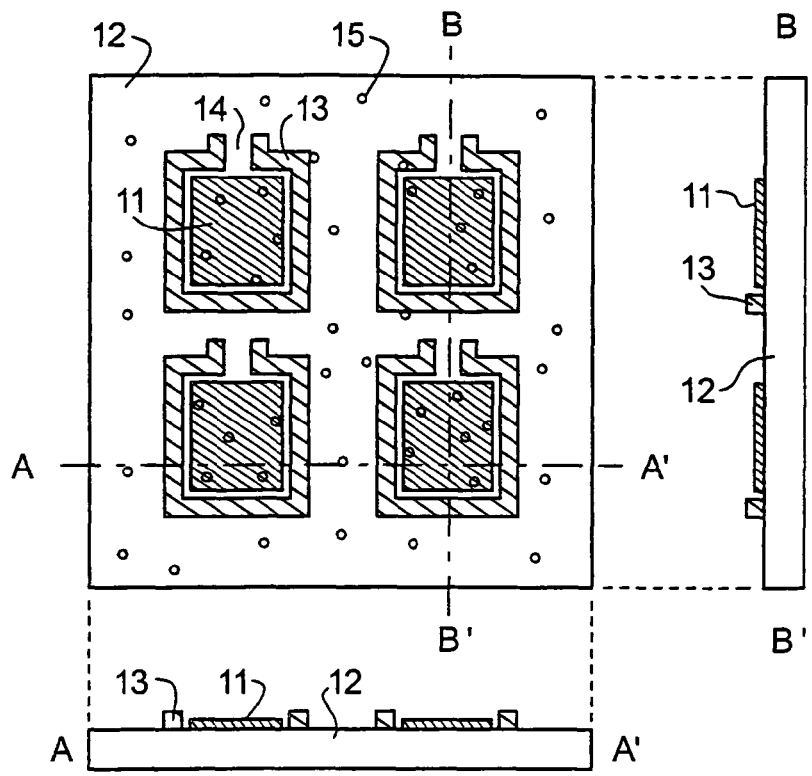
FIGS. 1A and 1B illustrate a multilayout process of a light emitting device.

First, as illustrated in FIG. 1A, a first sealing material 13 is formed on an insulator (here, a substrate) 12 having a plurality of pixel portions (regions for image display) 11 formed on the surface thereof. In the present embodiment mode, an example where four light emitting devices are formed from one substrate is illustrated, and thus, the first sealing material 13 is provided in four places. However, the number of places where the first sealing material 13 is provided may vary depending on the number of EL display devices to be formed from one substrate.

The first sealing material 13 may be formed using a dispenser method or a screen printing method which are conventional in a line for manufacturing liquid crystal cells. Here, as illustrated in FIG. 1A, openings 14 are formed to secure inlets from which encapsulant is injected later. As the first sealing material 13, ultraviolet curing resin, thermosetting resin, silicone resin, epoxy resin, acrylic resin, polyimide resin, phenolic resin, PVC (polyvinyl chloride), PVB (polyvinyl butyral), or EVA (ethylene vinyl acetate) can be used. Further, filler (bar-like or fiber-like spacers) may be added to the first sealing material 13.

Next, spherical spacers 15 are scattered over the whole surface of the substrate 12. As the spacers 15, conventional ones can be used. The spacers 15 may be scattered in a conventional wet or dry method before or after the first sealing material 13 is formed. In any case, the distance between the substrate 12 and a covering material to be disposed over the substrate 12 is secured by the filler (not shown) or the spacers 15.

It is to be noted that to make the spacers 15 hygroscopic is effective in suppressing the deterioration of the EL elements formed in the pixel portions 11. Spacers formed of a hygroscopic substance represented by barium oxide may be used. Further, it is preferable that the material of the spacers 15 transmits light emitted from the EL elements.

In the present embodiment mode, a region 16 surrounded by the first sealing material 13 includes a pixel portion containing an EL element and a TFT electrically connected to the EL element. Further, together with the pixel portion, a driving circuit for transmitting an electric signal to the pixel portion may also be included. Of course, the structure may be that only the pixel portion is provided inside the first sealing material 13 while the driving circuit is provided outside the first sealing material 13.

Figure 1B:
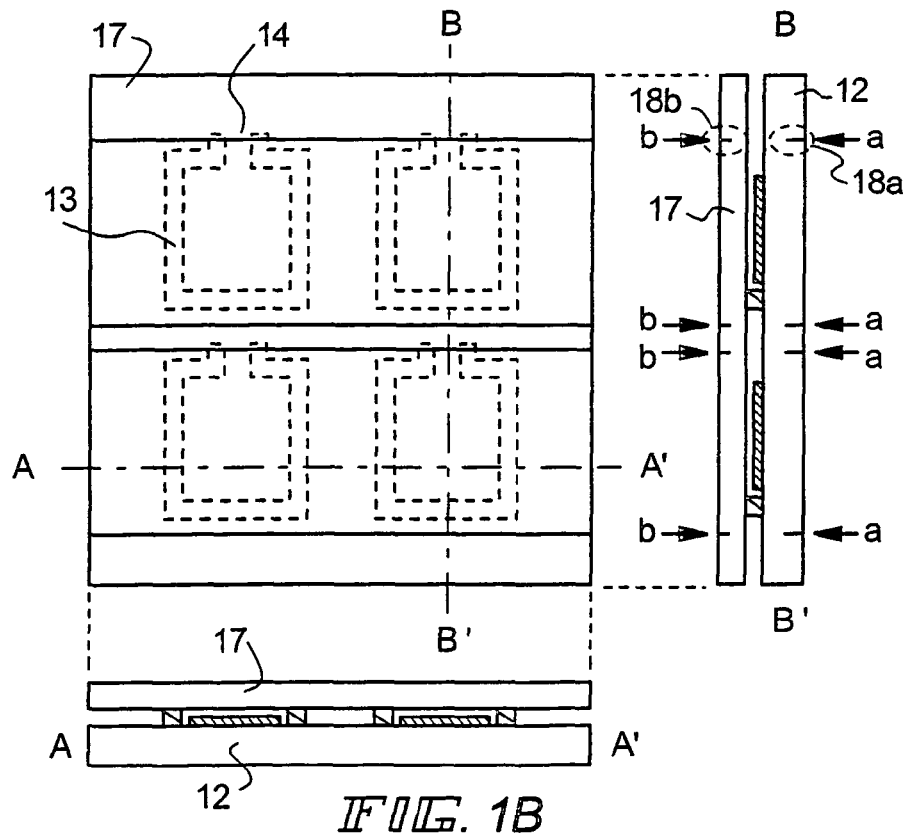

Next, as illustrated in FIG. 1B, a covering material 17 is adhered to the substrate 12 using the first sealing material 13. The substrate 12 which is integral with the first sealing material 13 and the covering material 17 is herein referred to as a cell forming substrate. As the process of adhering the covering material 17, a process similar to a conventional process of forming a liquid crystal cell may be used. More specifically, after the covering material 17 is aligned with and adhered to the substrate 12, pressure is applied, and the first sealing material 13 is cured by irradiation of ultraviolet or heating.

As the covering material 17, a substrate (or a film) having the same area as that of the substrate 12 may be used. As the substrate (or the film), a glass plate, a quartz plate, a plastic plate, a plastic film, an FRP (Fiberglass-Reinforced Plastics) plate, a PVF (polyvinyl fluoride) film, a Mylar™ film, a polyester film, or an acrylic film can be used.

Depending on the direction of light emitted from the EL element, it may be necessary to use a transparent substance. When a film is used as the substrate 12, it is preferable that ultraviolet curing resin is used as the first sealing material 13.

After the covering material 17 is adhered, the substrate 12 and the covering material 17 are cut. When the substrate 12 and the covering material 17 are cut, a conventional cutting device can be used. Typically, a scriber, a dicer, or a laser can be used. A scriber is a device which, after a narrow groove (scribe groove) is formed in a substrate, impacts the scribe groove to generate a crack along the scribe groove and to cut the substrate. A dicer is a device which cuts a substrate by bringing a hard cutter (also referred to as a dicing saw) which rotates at a high speed into contact with the substrate.

In the present embodiment mode, an example where a scriber is used as the cutting device is illustrated. With regard to the procedure to form scribe grooves in the substrate 12 and in the covering material 17, first, scribe grooves 18a are formed in the direction shown by arrows (a), and then, scribe grooves 18b are formed in the direction shown by arrows (b). Here, scribe grooves which pass nearby the openings 14 are formed so as to cut off the first sealing material 13. Since this makes the openings 14 appear at the end face of the cell, a subsequent process of injecting encapsulant is facilitated.

After the scribe grooves 18a and 18b are formed in this way, a resilient bar such as of silicone resin impacts the scribe grooves to generate cracks and to cut the substrate 12 and the covering material 17.

Figure 2A:
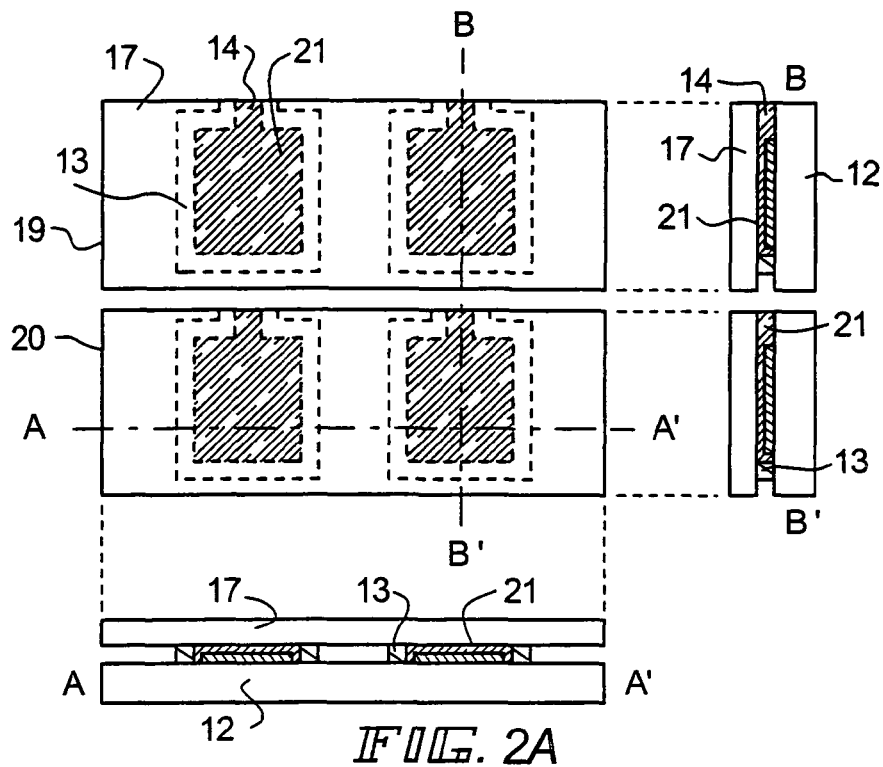
FIGS. 2A and 2B illustrate the multilayout process of a light emitting device.

FIG. 2A illustrates a state after the first cutting. Two cell forming substrates 19 and 20 including two cells, respectively, are formed. Then, encapsulant 21 is injected in the respective cells by vacuum injection. Vacuum injection is a well-known technique for injecting liquid crystal. More specifically, first, the cell forming substrates 19 and 20 are placed in a vacuum chamber, and the openings 14 are brought into contact with the encapsulant 21 in a vacuum. Then, gas is made to flow in the vacuum chamber to raise the internal pressure. By this, the encapsulant 21 is injected from the openings 14 into the cells.

It is to be noted that, in the present embodiment mode, if the viscosity of the encapsulant is not low, since the encapsulant is injected by vacuum injection, it takes a very long time to complete the injection. In this case, it is effective to inject the encapsulant after the encapsulant is heated to lower its viscosity.

Further, though it is preferable that resin which has low hygroscopicity is used as the encapsulant 21, a material which can be use for the first sealing material 13 may also be used. It is to be noted that, depending on the direction of light emitted from the EL element, it may be necessary to use a transparent substance.

Further, it is preferable that, as the encapsulant 21, one the viscosity of which is as low as that of liquid crystal is used. More specifically, it is desirable that the viscosity of the encapsulant 21 is 5-100 cp (preferably 10-30 cp). Encapsulant having such viscosity may be selected, or, encapsulant having higher viscosity may be diluted with a solvent or the like to have desired viscosity. Further, by adding to the encapsulant in advance a hygroscopic substance as a drying agent, deterioration of the EL elements can be further prevented.

Further, in case a material having high viscosity is used as the encapsulant, it is effective to inject the encapsulant after the encapsulant is heated. Even if the encapsulant has viscosity as high as $1 \times 10^4$ cp, it can be used in vacuum injection by heating it to 70-100° C.

In this way, the encapsulant 21 is filled as illustrated in FIG. 2A. It is to be noted that, though a method where the encapsulant 21 is filled simultaneously into a plurality of cells is described in the present embodiment mode, such a method is suitable when a small-sized EL display device such as 0.5-1 inch size one is manufactured. On the other hand, when a large-sized EL display device such as 5-30 inch size one is manufactured, the encapsulant 21 is filled after the cell forming substrate is cut into the respective cells.

After the encapsulant 21 is filled as described in the above, the encapsulant 21 is cured to further enhance the adherence between the substrate 12 and the covering material 17. If the encapsulant 21 is ultraviolet curing resin, ultraviolet is irradiated onto the encapsulant 21, while, if the encapsulant 21 is thermosetting resin, the encapsulant 21 is heated. It is to be noted that, in case thermosetting resin is used, it is necessary that the heat resistance of the organic EL material is taken into consideration.

Then, scribe grooves are again formed in the substrate 12 and in the covering material 17. With regard to the procedure to form the scribe grooves, first, scribe grooves 22a are formed in the direction shown by arrows (a), and then, scribe grooves 22b are formed in the direction shown by arrows (b). Here, the scribe grooves are formed such that, after the cutting, the area of the covering material 17 is smaller than that of the substrate 12.

Figure 3A:
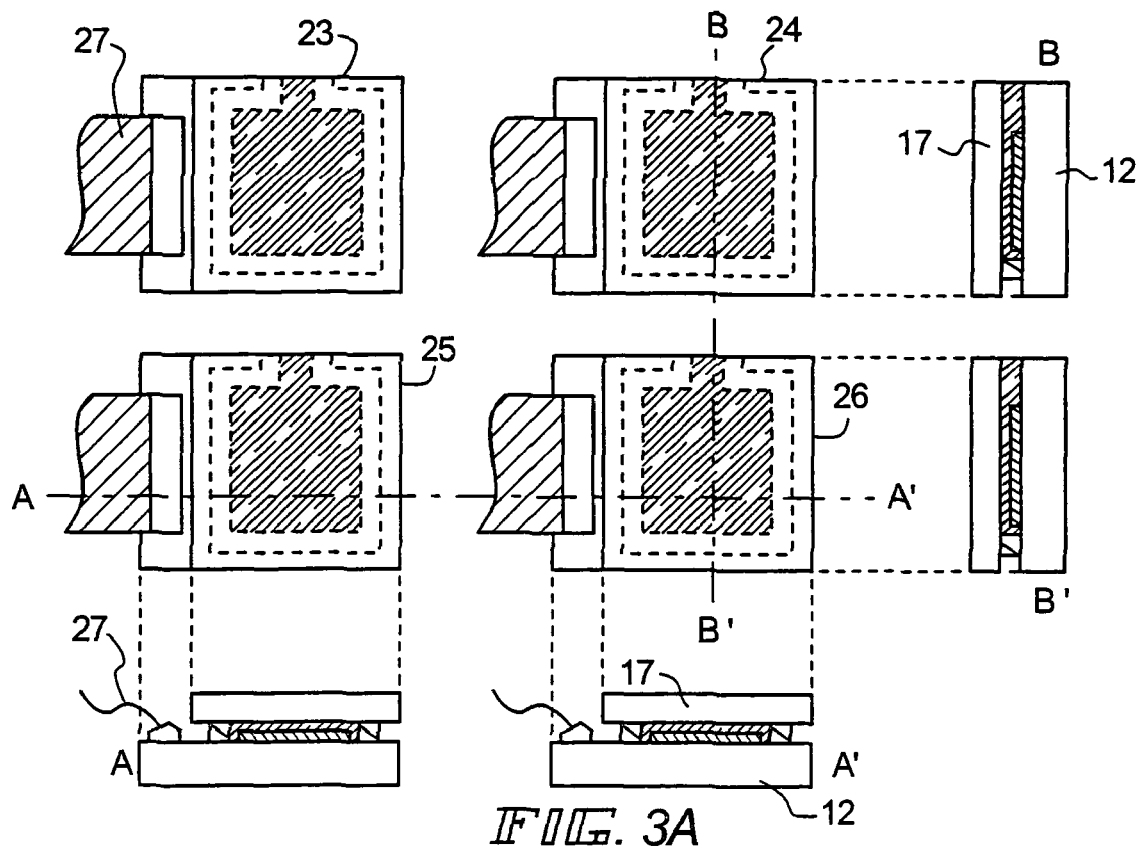
FIGS. 3A and 3B illustrate the multilayout process of a light emitting device.

After the scribe grooves 22a and 22b are formed in this way, the scribe grooves are impacted as described in the above to cut the substrate 12 and the covering material 17 into cell forming substrates 23-26. FIG. 3A illustrates a state after the second cutting. Further, an FPC (a flexible print circuit) 27 is attached to each of the cell forming substrates 23-26 as a connecting terminal. The FPC 27 is a terminal for inputting from an external apparatus an electric signal to be sent to the pixel portion. Of course, it may also be used as a terminal for outputting to an external apparatus an image displayed by the pixel portion.

Figure 3B:
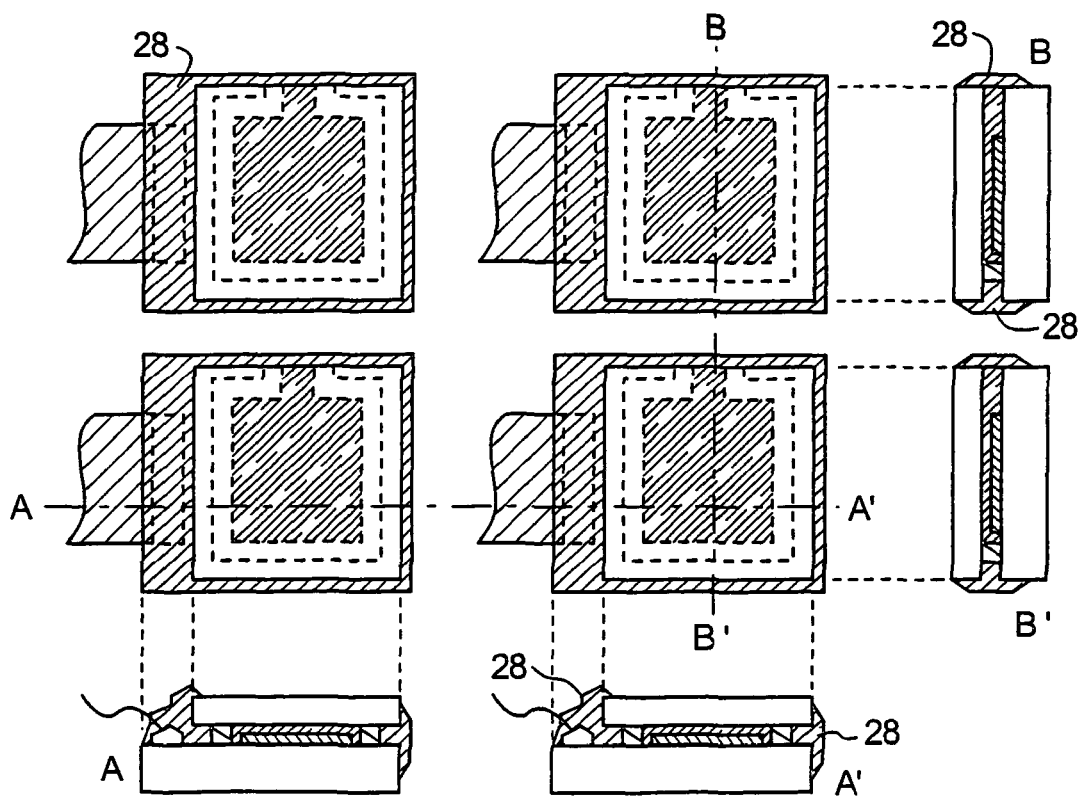

Finally, as illustrated in FIG. 3B, a second sealing material 28 is formed so as to abut the end faces of the cell forming substrates 23-26 (the exposed portions of the first sealing material 13 and/or the encapsulant 21) and a part of the FPC 27 as the connecting terminal. As the second sealing material 28, materials which can be used for the first sealing material 13 can be used.

In the process described in the above, an EL display device as illustrated in FIG. 3B is completed. As described in the above, according to the present invention, a plurality of EL display devices can be manufactured from one substrate in a manufacturing line using apparatus similar to those used in a process of forming liquid crystal cells. For example, with only small modifications of a liquid crystal manufacturing line for a 620 mm×720 mm substrate, six EL display devices of 13-14 inch size ones can be manufactured from one substrate. Therefore, the throughput can be greatly improved and the manufacturing cost can be greatly reduced.

Embodiment 1

The active matrix type EL display device of the present invention will be explained in Embodiment 1 with reference to FIGS. 4(A) and 4(B). FIG. 4(A) is a top view showing the state of the device in which sealing of the EL element formed on the active matrix substrate is completed. Indicated by dotted lines, reference numeral 401 denotes a source driver circuit, 402 denotes a gate driver circuit, 403 denotes a pixel portion. Further, reference numeral 404 denotes a covering member, 405 denotes a first sealing member, and 406 denotes a second sealing member. A filler 407 (refer to FIG. 4(B)) is filled between the covering member and the active matrix substrate surrounded by the first sealing member 405.

Denoted by reference numeral 408 is a connecting wiring for transmitting a signal to be inputted to the source driver circuit 401, the gate driver circuit 402, and the pixel portion 403. The connecting wiring receives a video signal and a clock signal from an FPC (Flexible Print Circuit) 409 serving as a connecting terminal to an external equipment.

Shown in FIG. 4(B) is a sectional view corresponding to the cross-section taken along the line A-A' of FIG. 4(A). In FIGS. 4(A) and 4(B), the same reference numerals are used to denote the same components.

As shown in FIG. 4(B), the pixel portion 403 and the source driver circuit 401 are formed on a substrate 300. The pixel portion 403 is composed of a plurality of pixels each including a TFT 301 for controlling a current flowing to an EL element (hereinafter referred to as a TFT for controlling a current) and a pixel electrode 302 that is electrically connected to the drain of the TFT. Furthermore, the source driver circuit 401 is formed using a CMOS circuit in which an N channel TFT 303 and a P channel TFT 304 are combined complementarily.

Next, the pixel electrode 302 is formed of a transparent conductive film and functions as the cathode of the EL element. An insulating film 305 is formed on each end of the pixel electrode 302 to thereby further form a light-emitting layer 306, and a hole injection layer 307. Further, the anode 308 of the EL element is formed of a transparent conductive film thereon.

As a film formation method of the light emitting layer 306 and a hole injection layer 307, any known means may be used and not only an organic material but also an inorganic material can be used as the material. Also note that, though the structure shown here is composed of the light-emitting layer and hole injection layer, it may be a laminate structure in which an electron injection layer, an electron transportation layer, a hole transportation layer, and the like are combined.

Further, in the case of the present embodiment, the anode 308 functions as a common wiring shared by all the pixels, and is electrically connected to the FPC 409 via the connecting wiring 408.

Next, according to the present invention, the first sealing member 405 is formed using a dispenser or the like, and a spacer (not shown) is sprayed, followed by bonding the covering member 404 by the first sealing member. The filler 407 is then filled into the space surrounded by the active matrix substrate, the covering member 404, and the first sealing member 405 by vacuum injection.

In Embodiment 1, barium oxide as a moisture absorbent material is added into the filler 407 in advance. Note that though the moisture absorbent material is added into the filler used in Embodiment 1, it can be massively dispersed and sealed within the filler. In addition, it is also possible to use a moisture absorbent material as the material of a spacer not shown in the drawing.

After curing the filler 407 with ultraviolet irradiation or heat, an opening portion (not shown) formed in the first sealing member 405 is sealed up. Then, the second sealing member 406 is disposed so as to cover exposing portions of the first sealing member 405 and the filler 407, and a portion of the FPC 409. The second sealing member 406 may be formed from the same material as the first sealing member 407.

By sealing the EL element within the filler 407 using the method as described above, the EL element is completely cut off from external and invasion from the outside by substances that accelerate the oxidation degradation of the organic material, such as moisture and oxygen, can thus be prevented. Accordingly, an EL display device of high reliability can be manufactured.

Because the production line of existing liquid crystal display devices can be redirected by employing the present invention, a sharp reduction in the cost of maintenance investment is possible. A plurality of light-emitting devices can be fabricated from one piece of substrate through a process of high yield, resulting in making a substantial cutback in manufacturing cost.

Embodiment 2

Figure 5:
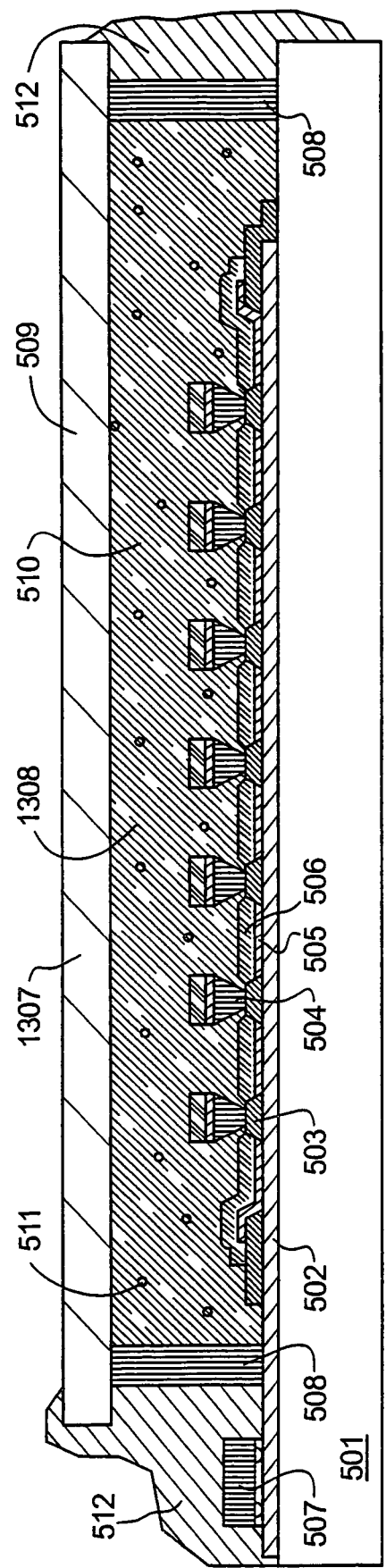
FIG. 5 illustrates a sectional structure of an EL display device.

In the present embodiment, a passive matrix EL display device manufactured according to the present invention is described with reference to FIG. 5. In FIG. 5, a reference numeral 501 denotes a plastic substrate and a reference numeral 502 is a cathode formed of aluminum alloy. In the present embodiment, the cathode 502 is formed by vapor deposition. It is to be noted that, though not shown in FIG. 5, a plurality of cathodes are arranged like stripes in the direction parallel to the plane of the figure.

Further, an insulating film 503 is formed orthogonally with respect to the cathodes 502 arranged like stripes. The insulating film 503 is also provided between the cathodes 502 so as to insulate and separate the cathodes 502 from one another. Therefore, the insulating film 503 is patterned to be matrix-like when viewed from the top.

Further, a bank 504 formed of resin is formed on the insulating film 503. The bank 504 is formed in the direction perpendicular to the plane of the figure so as to be orthogonal to the cathodes 502. The bank 504 is processed to have an upside-down triangular shape (an upside-down tapered shape).

Next, a light emitting layer 505 and an anode 506 formed of a transparent conductive film are continuously formed. Since the light emitting layer 505 is easily affected by moisture or oxygen, it is desirable that the light emitting layer 505 and the anode 506 are continuously formed in a vacuum or an inert atmosphere. Though the light emitting layer 505 may be formed of any conventional material, an organic polymer material is preferable from the viewpoint of the simplicity of film formation. Further, it is preferable that the anode 506 is provided by vapor deposition. Both the light emitting layer 505 and the anode 506 are formed along grooves formed by the bank 504, and are arranged like stripes in the direction perpendicular to the plane of the figure.

It is to be noted that, though not shown in the figure, it is effective to provide between the light emitting layer 505 and the anode 506 a hole transport layer or a hole injection layer as a buffer layer. As such a hole injection layer, copper phthalocyanine, polythiophene, PEDOT, or the like can be used.

As described in the above, an EL element is formed on the substrate 501. It is to be noted that, since, in the present embodiment, the lower electrode is a cathode which does not transmit light, light generated by the light emitting layer 505 is emitted to the upper surface side of the figure (the side opposite to the substrate 501). However, the structure of the EL element may be upside down and the lower electrode may be the anode formed of a transparent conductive film. In this case, light generated by the light emitting layer 505 is emitted to the lower surface side of the figure (the side of the substrate 501).

Further, an IC chip 507 is provided on the substrate 501 by a bump method. The IC chip 507 is provided as a driving circuit for transmitting an electric signal to the cathode 502 and to the anode 506, and processes a signal from an external apparatus by an FPC (a flexible print circuit) which is not shown.

After that, the EL element is encapsulated according to the present invention. In the present embodiment, ultraviolet curing resin is used as a first sealing material 508, a glass substrate is adhered as a covering material 509, and encapsulant 510 is filled by vacuum injection. As a hygroscopic substance 511, barium oxide is added to the encapsulant 510. It is to be noted that, in the present embodiment, epoxy resin is used as the encapsulant 510. Further, in case light generated by the light emitting layer 505 is emitted to the lower surface side, the covering material 509 is not required to be transparent.

After the injection of the encapsulant 510 is completed in this way, the opening (not shown) provided in the first sealing material 508 is closed, and a second sealing material 512 covers the exposed portions of the first sealing material 508 and the IC chip 507. Here, though not shown, the second sealing material 512 may be provided so as to cover a part of the FPC.

By encapsulating the EL element in the encapsulant 510 using the method described in the above, the EL element can be completely isolated from the external, and substances such as moisture and oxygen which promote oxidation of the organic material can be prevented from entering. Therefore, a reliable EL display device can be manufactured.

Further, according to the present invention, since an existing line for manufacturing liquid crystal display devices can be diverted, the cost of the investment in plant and equipment can be greatly reduced, and a plurality of light emitting devices can be manufactured from one substrate in a process having a high yield, and thus, the manufacturing cost can be greatly reduced.

Embodiment 3

In the present embodiment, a case where encapsulant is formed in a different way from that described with reference to FIGS. 1A to 3B is described. The description is made with reference to FIGS. 6A and 6B.

Figure 6A:
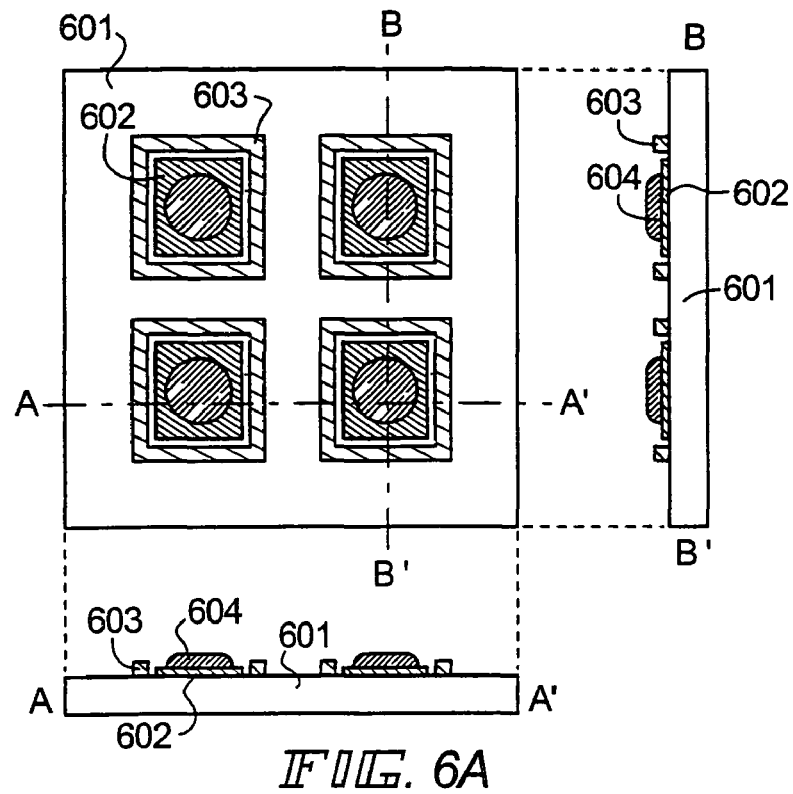
FIGS. 6A and 6B illustrate another multilayout process of a light emitting device.

In FIG. 6A, reference numerals 601, 602, and 603 denote a substrate, a pixel portion, and a first sealing material, respectively. It is to be noted that, though not shown in the figure, spacers may be scattered. As the first sealing material 603, the material of the first sealing material 13 described in the embodiment mode can be used. However, differently from the case illustrated in FIGS. 1A and 1B, in the present embodiment, no opening is provided in the first sealing material 603. More specifically, at this point, the first sealing material 603 is formed so as to form a completely closed space (so as to form a completely surrounded region).

Then, encapsulant 604 is dropped on the pixel portion 602 in the region surrounded by the first sealing material 603. Of course, a hygroscopic substance (not shown) may be added to the encapsulant 604 in advance. As the hygroscopic substance, the ones described in the embodiment mode can be used. The dropping process can be carried out by using a film forming applicator such as a dispenser used in forming the first sealing material 603.

Further, the process of dropping the encapsulant 604 is preferably carried out in a glove box and in an inert atmosphere such as nitrogen or argon. Here, it is desirable that the concentration of oxygen in the inert atmosphere is as low as possible, preferably 1 ppm or lower (more preferably, 0.1 ppm or lower).

Figure 6B:
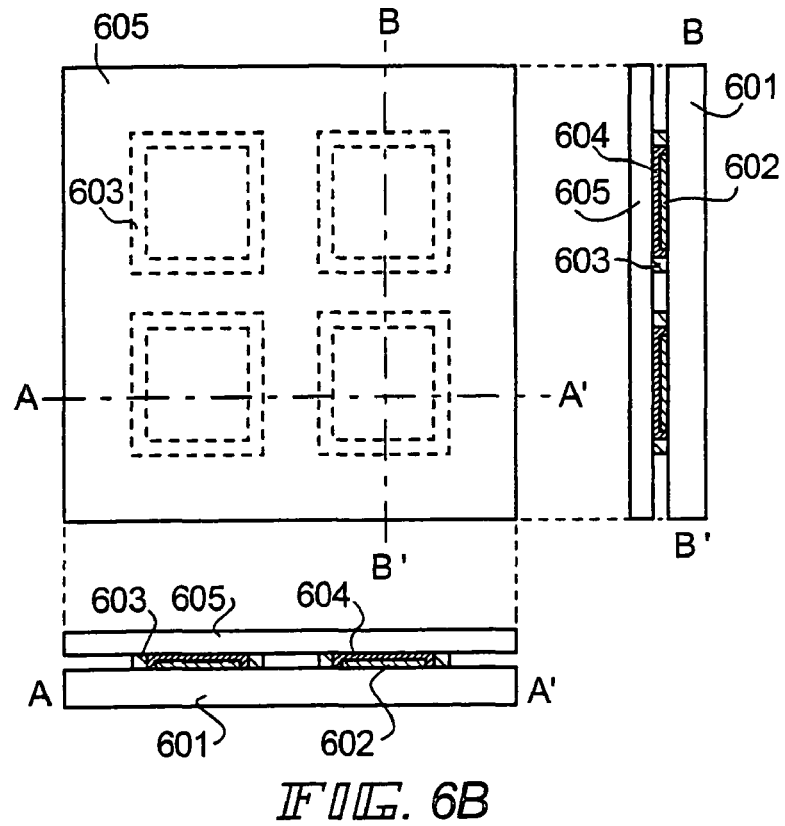

Then, as illustrated in FIG. 6B, a covering material 605 is adhered by the first sealing material 603. Here, the encapsulant 604 dropped as illustrated in FIG. 6A is pressed down by the covering material 605, and fills the closed space surrounded by the substrate 601, the first sealing material 603, and the covering material 605. It is to be noted that the optimum drop amount of the encapsulant 604 is required to be calculated from the capacity of the closed space which is also required to be calculated in advance.

As described in the embodiment mode, when the encapsulant is injected by vacuum injection, if the viscosity of the encapsulant is not low, there is a fear that the throughput may be lowered. However, in the present embodiment, since the encapsulant is dropped and then fills the closed space when pressed down, there is an advantage that, even if a highly viscous material is used, almost no problem arises.

After the covering material 605 is adhered as described in the above, similarly to the case of the embodiment mode, the substrate 601 and the covering material 605 are cut by a scriber, a dicer, or a laser, and an FPC and/or an IC chip is attached to complete an active matrix EL display device or a passive matrix EL display device.

It is to be noted that the present embodiment may be implemented both with the active matrix EL display device described in Embodiment 1 and with the passive matrix EL display device described in Embodiment 2. Further, since a line for manufacturing liquid crystal display devices can be diverted without adding special equipment, the manufacturing cost can be greatly reduced.

Embodiment 4

In the present embodiment, a case where encapsulant is formed in a different way from that described with reference to FIGS. 1A to 3B is described. The description is made with reference to FIGS. 7A and 7B.

Figure 7A:
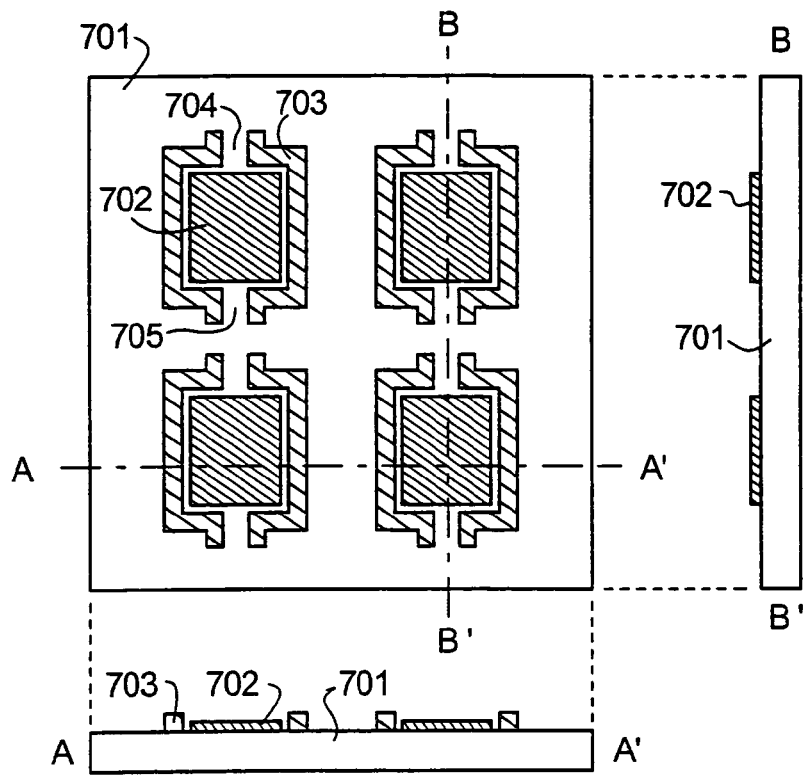
FIGS. 7A and 7B illustrate still another multilayout process of a light emitting device.

In FIG. 7A, reference numerals 701, 702, and 703 denote a substrate, a pixel portion, and a first sealing material, respectively. It is to be noted that, though not shown in the figure, spacers may be scattered. As the first sealing material 703, the material of the first sealing material 13 described in the embodiment mode can be used. However, differently from the case illustrated in FIGS. 1A and 1B, in the present embodiment, two openings 704 and 705 are provided in the first sealing material 703.

Figure 7B:
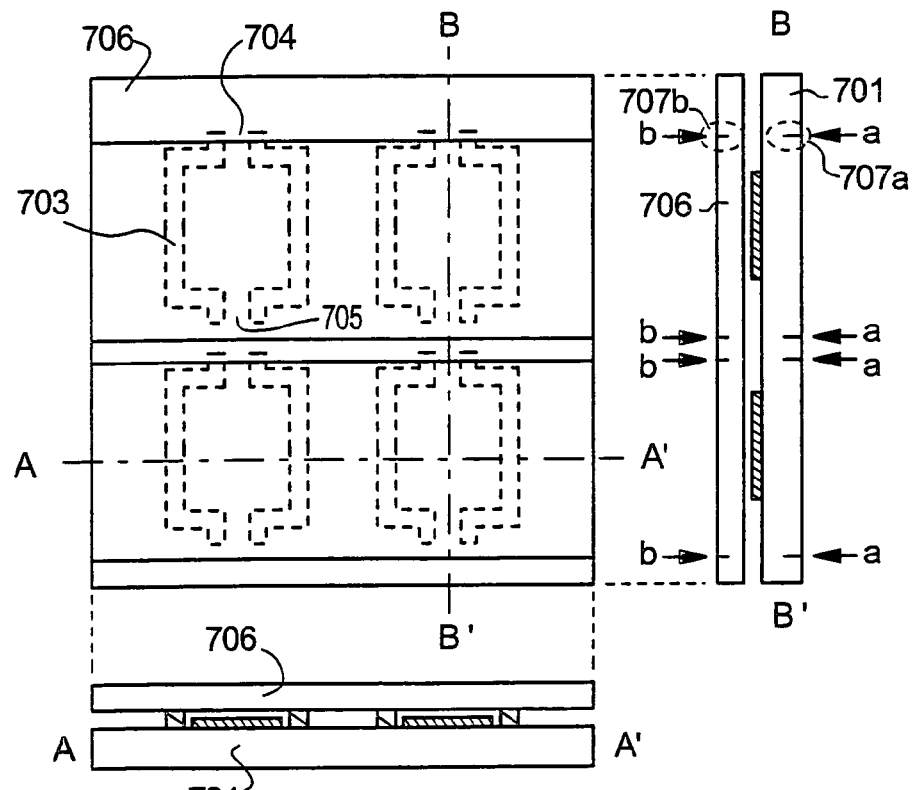

Then, as illustrated in FIG. 7B, a covering material 706 is adhered, scribe grooves are formed in the directions shown by arrows 707a and 707b, and the substrate 701 and the covering material 706 are cut.

After that, by bringing encapsulant in contact with the opening 704, the capillary action injects the encapsulant (not shown) into a cell 708. In this way, the present embodiment is characteristic in that the capillary action is utilized in injecting the encapsulant.

The process of injecting the encapsulant is preferably carried out in a glove box and in an inert atmosphere such as nitrogen or argon. Here, it is desirable that the concentration of oxygen in the inert atmosphere is as low as possible, preferably 1 ppm or lower (more preferably, 0.1 ppm or lower).

Figure 2B:
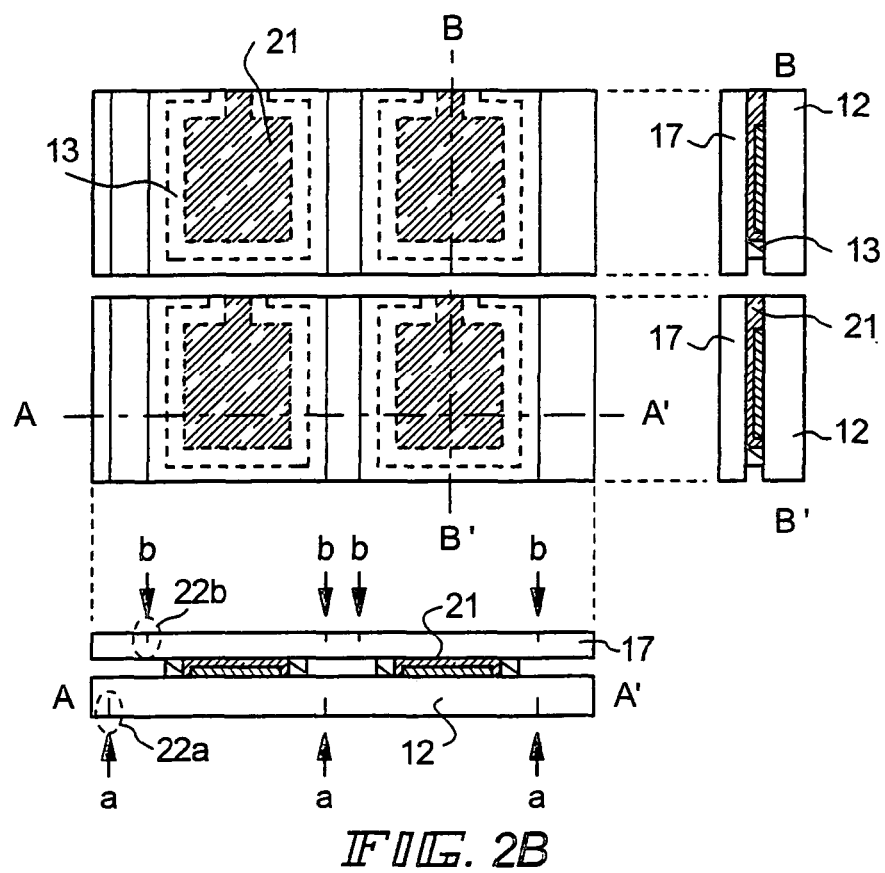

After the encapsulant is injected, by carrying out processes similar to those illustrated in FIG. 2B and the following, an active matrix or passive matrix light emitting device or a light emitting device as the light source can be manufactured.

Embodiment 5

The present invention is implemented for a light emitting device in which an EL element is provided on an entire surface of a substrate. Such a light emitting device (EL light emitting device) can be used as the light source for light emission in face shape and used as a back light of a liquid crystal display device (liquid crystal display).

In an EL light emitting device according to the present embodiment, it is very important to seal an EL element, so that it is preferable to use the present invention for a sealing technique.

Embodiment 6

Examples of a light emitting device using an EL element are described in Embodiments 1 to 5. Further, the present invention can be used for an EC (Electrochromics) display device, a field emission display (FED), or a light emitting device comprising a light emission diode using semiconductor.

In particular, with regard to an EC display device, since a material indicating EC phenomenon is easily affected by oxygen or moisture in the same as an EL element, it is preferable to keep air tightness by being cut off from air. At the time, by implementing the present invention, production yield can be largely improved and further the manufacturing cost can be reduced.

Embodiment 7

In the embodiment mode and Embodiments 1-6, since it is important not to expose the light emitting element to oxygen and moisture after the light emitting element is formed, the encapsulating process according to the present invention is, in all cases, carried out in an inert atmosphere or in a vacuum.

An inert atmosphere is a space filled with nitrogen or rare gas (representatively, helium, argon, or neon), and is sometimes referred to as a glove box. In the present invention, since the series of processes described with reference to FIGS. 1A-3B are all carried out in an inert atmosphere or in a vacuum, it is preferable that the whole manufacturing line is in an inert atmosphere.

For example, in a clean room, the place where an apparatus which carries out the series of encapsulating processes described with reference to FIGS. 1A-3B is installed is surrounded by walls or films to be a closed space and is filled with nitrogen or rare gas. In this case, by making the pressure inside the space positive with nitrogen or rare gas, oxygen and moisture are prevented from entering the space.

Further, it is also possible to make the clean room, where an apparatus which carries out the series of encapsulating processes described with reference to FIGS. 1A-3B is installed, to be as a whole in an inert atmosphere with the concentration of oxygen being 1 ppm or lower. In this case, it is necessary that the operation of the apparatus is automated.

Embodiment 8

A light emitting device formed by implementing the present invention has superior visibility in bright locations in comparison to a liquid crystal display device because it is a self-emissive type device, and moreover its angle of vision is wide. Accordingly, it can be used as a display portion for various electronic equipment. For example, for appreciation of TV broadcasts by large screen, it is appropriate to use a display of the present invention incorporating the light emitting device in its casing and having a diagonal equal to 20 to 60 inches.

Note that all displays for exhibiting information such as a personal computer display, a TV broadcast reception display, or an advertisement display are included as the display incorporating a light emitting device in its casing. Further, the light emitting device of the present invention can be used as a display portion of the other various electronic equipment.

The following can be given as examples of such electronic equipment: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the angle of vision is regarded as very important. Thus, it is preferable that the EL display device is employed. Examples of these electronic equipment are shown in FIGS. 8 and 9.

Figure 8A:
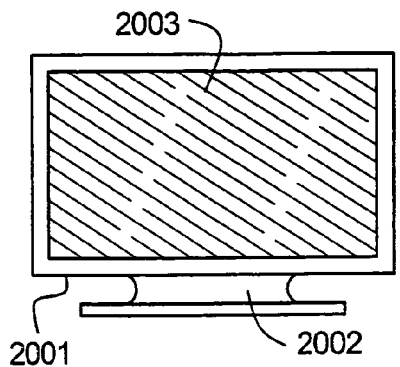
FIGS. 8A to 8F illustrate electric apparatuses according to the present invention.

FIG. 8(A) is a display incorporating a light emitting device in its casing, containing a casing 2001, a support stand 2002, and a display portion 2003. The present invention can be used in the display portion 2003. Since the display is a self-emissive type device without the need of a backlight, its display portion can be made thinner than a liquid crystal display device.

Figure 8B:
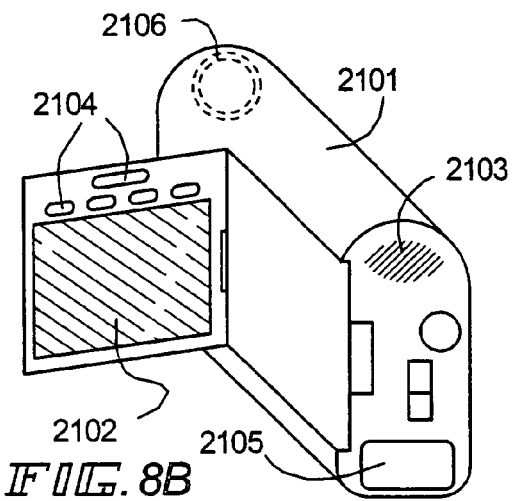

FIG. 8(B) is a video camera, containing a main body 2101, a display portion 2102, a voice input portion 2103, operation switches 2104, a battery 2105, and an image receiving portion 2106. The light emitting device of the present invention can be used in the display portion 2102.

Figure 8C:
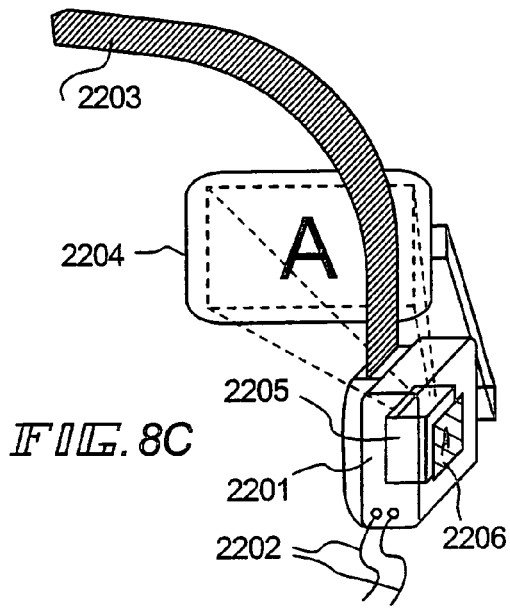

FIG. 8(C) is a portion of a head fitting type EL display (right side), containing a main body 2201, a signal cable 2202, a head fixing band 2203, a display portion 2204, an optical system 2205, and a light emitting device 2206. The present invention can be used in the light emitting device 2206.

Figure 8D:
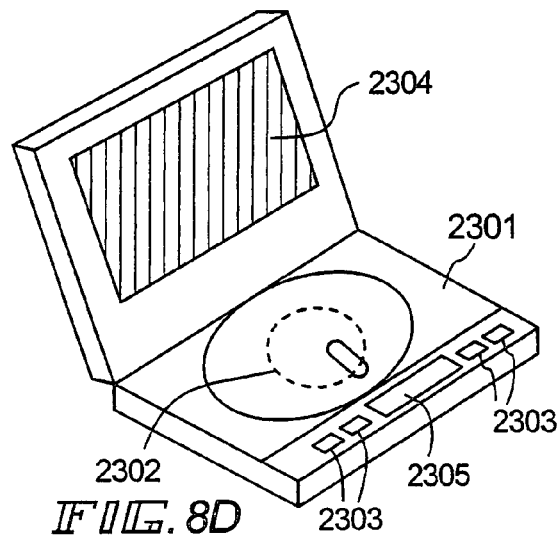

FIG. 8(D) is an image playback device (specifically, a DVD playback device) provided with a recording medium, containing a main body 2301, a recording medium (such as a DVD) 2302, operation switches 2303, a display portion (a) 2304, and a display portion (b) 2305. The display portion (a) is mainly used for displaying image information, and the image portion (b) is mainly used for displaying character information, and the light emitting device of the present invention can be used in these image portions (a) and (b). Note that domestic game equipment is included as the image playback device provided with a recording medium.

Figure 8E:
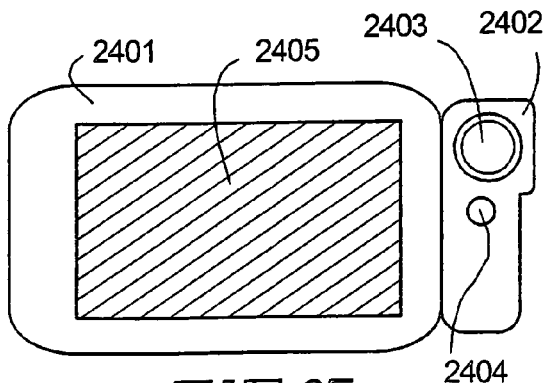

FIG. 8(E) is a mobile computer, containing a main body 2401, a camera portion 2402, an image receiving portion 2403, operation switches 2404, and a display portion 2405. The light emitting device of the present invention can be used in the display portion 2405.

Figure 8F:
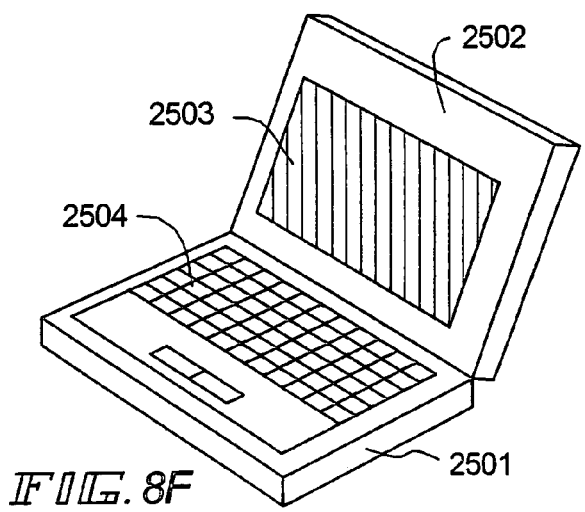

FIG. 8(F) is a personal computer, containing a main body 2501, a casing 2502, a display portion 2503, and a keyboard 2504. The light emitting device of the present invention can be used in the display portion 2503.

Note that in the future if the emission luminance becomes higher, the projection of light including outputted images can be enlarged by lenses, optical fiber, or the like. Then it will become possible to use the light emitting device in a front type or a rear type projector.

The emitting portion of the light emitting device consumes power, and therefore it is preferable to display information so as to have the emitting portion become as small as possible. Therefore, when using the light emitting device in a display portion which mainly displays character information, such as a portable information terminal, in particular, a portable telephone and an audio reproducing device, it is preferable to drive it by setting non-emitting portions as background and forming character information in emitting portions.

Figure 9A:
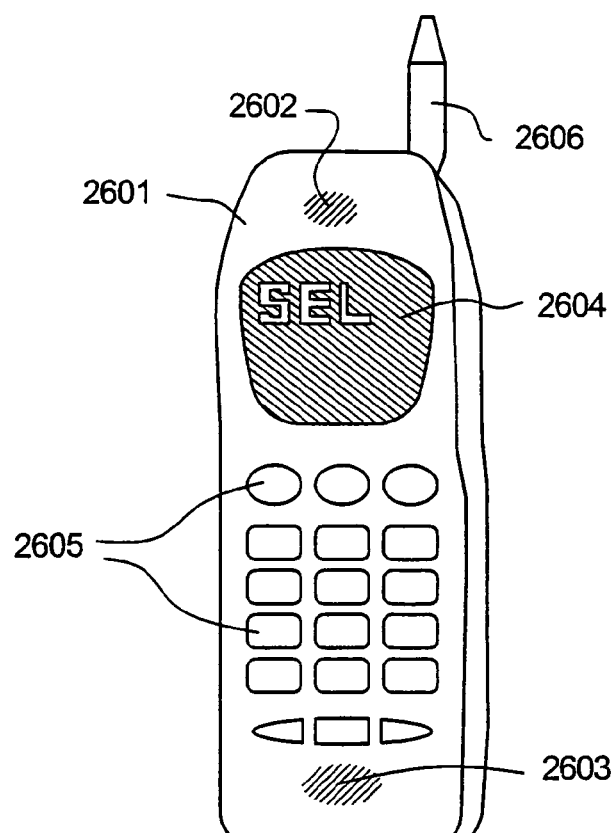
FIGS. 9A and 9B illustrate electric apparatuses according to the present invention.

FIG. 9(A) is a portable telephone, containing a main body 2601, a voice output portion 2602, a voice input portion 2603, a display portion 2604, operation switches 2605, and an antenna 2606. The light emitting device of the present invention can be used in the display portion 2604. Note that by displaying white characters in a black background in the display portion 2604, the power consumption of the portable telephone can be reduced.

Figure 9B:
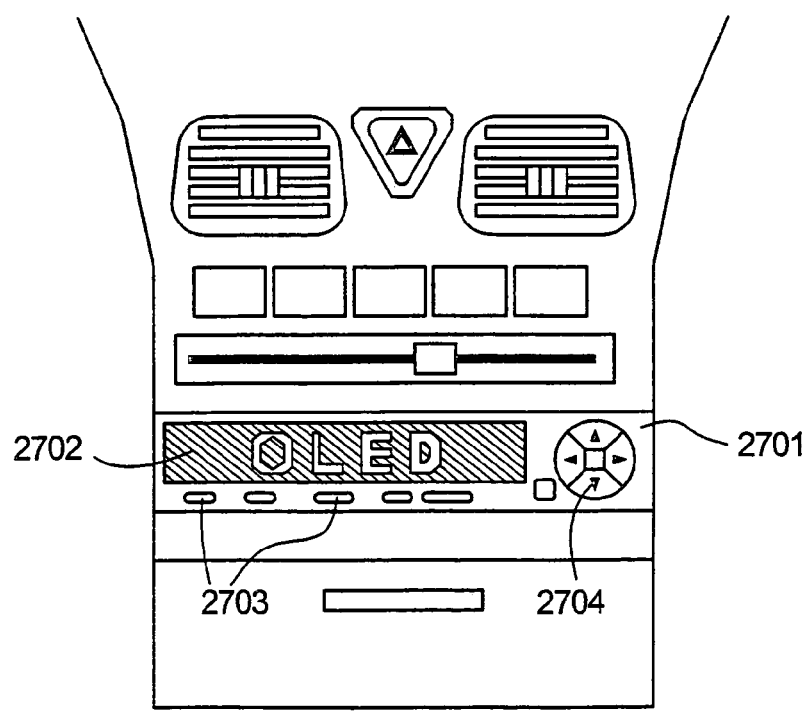

FIG. 9(B) is an audio reproducing device, specifically a car audio system, containing a main body 2701, a display portion 2702, and operation switches 2703 and 2704. The light emitting device of the present invention can be used in the display portion 2702. Furthermore, an audio reproducing device for a car is shown in Embodiment 8, but it may also be used for a mobile type and a domestic type of audio reproducing device. Note that by displaying white characters in a black background in the display portion 2704, the power consumption can be reduced. This is particularly effective in a mobile type audio reproducing device.

The range of applications of the present invention is thus extremely wide, and it is possible to apply the present invention to electronic equipment in all fields. Furthermore, any constitution of the light emitting device shown in Embodiments 1 to 6 may be employed in the electronic equipment of Embodiment 8.

Embodiment 9

In case an electric apparatus having as its display portion a light emitting device according to the present invention is used outdoors, of course the display portion is viewed sometimes when it is dark and sometimes when it is light. Though, when it is dark, what is displayed can be sufficiently recognized even if the luminance is not so high, when it is light, what is displayed may not be recognized if the luminance is not high.

With regard to a light emitting device, since the luminance varies in proportion to the current or the voltage for operating the element, if the luminance is required to be higher, the power consumption has to be increased accordingly. However, if the level of the luminance of light emission is adjusted to be so high, when it is dark, the display is much brighter than needed with the power consumption being unnecessarily large.

In order to provide for such a case, it is effective to provide a light emitting device according to the present invention with a function to sense with a sensor the brightness of the environment and to adjust the luminance of light emission according to the extent of the brightness. More specifically, the luminance of light emission is made high when it is light, while the luminance of light emission is made low when it is dark. As a result, a light emitting device which can prevent the power consumption from increasing and which does not make the user feel fatigued can be materialized.

It is to be noted that, as such a sensor for sensing the brightness of the environment, a CMOS sensor or a CCD (charge-coupled device) can be used. Such a CMOS sensor may be conventionally integrally formed on a substrate where a light emitting element is formed, or a semiconductor chip having the CMOS sensor formed thereon may be attached to the outside. Further, a semiconductor chip having such a CCD formed thereon may be attached to a substrate where a light emitting element is formed, or a part of the electric apparatus having as its display portion the light emitting device may be structured to be provided with the CCD or the CMOS sensor.

A control circuit for changing the current or the voltage for operating the light emitting element in response to a signal obtained by the sensor for sensing the brightness of the environment is provided, by which the luminance of light emission of the light emitting element can be adjusted according to the brightness of the environment. It is to be noted that such adjustment may be made either automatically or manually.

It is to be noted that the structure of the present embodiment can be implemented in any electric apparatus described in Embodiment 8.

By implementing the present invention, in a multilayout process for manufacturing a plurality of light emitting devices from one large-sized substrate, the throughput and the yield can be improved.

Further, since an existing line for manufacturing liquid crystal display devices can be diverted, the cost of the investment in plant and equipment can be reduced, and the manufacturing cost can be greatly reduced. Since the manufacturing cost can be reduced, the cost of the light emitting device can be reduced, and further, the cost of an electric apparatus using such a light emitting device can also be reduced.

What is claimed is:

1. A passive matrix display device, comprising:
    an EL element formed over a first surface of a first substrate;
    a first sealing material surrounding said EL element, said first sealing material having an opening;
    a first surface of a second substrate adhered to said first surface of said first substrate by said first sealing material;
    an IC chip provided outside said first sealing material over said first surface of said first substrate;
    a second sealing material covering said IC chip, said first sealing material and a portion of a second surface perpendicular to said first surface of said second substrate; and
    a third sealing material covering said first sealing material and said opening;
    wherein said third sealing material covers a portion of a second surface perpendicular to said first surface of said first substrate and a portion of a second surface perpendicular to said first surface of said second substrate.

2. A passive matrix display device according to claim 1, wherein said first substrate is a plastic substrate.

3. A passive matrix display device according to claim 1, wherein said second substrate is a glass substrate.

4. A passive matrix display device according to claim 1, wherein an encapsulant is provided in a portion surrounded by said first substrate, said first sealing material and said second substrate.

5. A passive matrix display device according to claim 4, wherein said encapsulant comprises resin.

6. A portable telephone having said passive matrix display device according to claim 1.

7. A passive matrix display device, comprising:
    an EL element formed over a first surface of a first substrate;
    a first sealing material surrounding said EL element, said first sealing material having an opening;
    a first surface of a second substrate adhered to said first surface of said first substrate by said first sealing material;
    an IC chip provided outside said first sealing material over said first surface of said first substrate;
    a second sealing material covering said IC chip, said first sealing material and a portion of a second surface perpendicular to said first surface of said second substrate; and
    a third sealing material covering said first sealing material and said opening,
    wherein said first sealing material is sandwiched in between said first surface of said first substrate and said first substrate of said second substrate, and
    wherein said third sealing material covers a portion of a second surface perpendicular to said first surface of said first substrate and a portion of a second surface perpendicular to said first surface of said second substrate.

8. A passive matrix display device according to claim 7, wherein said first substrate is a plastic substrate.

9. A passive matrix display device according to claim 7, wherein said second substrate is a glass substrate.

10. A passive matrix display device according to claim 7, wherein an encapsulant is provided in a portion surrounded by said first substrate, said first sealing material and said second substrate.

11. A passive matrix display device according to claim 10, wherein said encapsulant comprises resin.

12. A portable telephone having said passive matrix display device according to claim 7.

13. A passive matrix display device, comprising:
    an EL element formed over a first surface of a first substrate;
    a first sealing material surrounding said EL element, said first sealing material having an opening;
    a first surface of a second substrate adhered to said first surface of said first substrate by said first sealing material;
    an IC chip provided outside said first sealing material over said first surface of said first substrate;
    a second sealing material covering said IC chip, said first sealing material and a portion of a second surface perpendicular to said first surface of said second substrate;
    a third sealing material covering said first sealing material and said opening,
    wherein said third sealing material covers a portion of a second surface perpendicular to said first surface of said first substrate and a portion of a second surface perpendicular to said first surface of said second substrate, and
    wherein said EL element is configured to emit light to said second substrate.

14. A passive matrix display device according to claim 13, wherein said first substrate is a plastic substrate.

15. A passive matrix display device according to claim 13, wherein said second substrate is a glass substrate.

16. A passive matrix display device according to claim 13, wherein an encapsulant is provided in a portion surrounded by said first substrate, said first sealing material and said second substrate.

17. A passive matrix display device according to claim 16, wherein said encapsulant comprises resin.

18. A portable telephone having said passive matrix display device according to claim 13.

19. A passive matrix display device, comprising:
    an EL element formed over a first surface of a first substrate;
    a first sealing material surrounding said EL element, said first sealing material having an opening;
    a first surface of a second substrate adhered to said first surface of said first substrate by said first sealing material;
    an IC chip provided outside said first sealing material over said first substrate; and
    a second sealing material covering said IC chip, said first sealing material and a portion of a second surface of perpendicular to said first surface of said first substrate; and
    a third sealing material covering said first sealing material and said opening,
    wherein said third sealing material covers a portion of a second surface perpendicular to said first surface of said first substrate and a portion of a second surface perpendicular to said first surface of said second substrate, wherein said first sealing material is sandwiched in between said first surface of said first substrate and said first surface of said second substrate, and wherein said EL element is configured to emit light to said second substrate.

20. A passive matrix display device according to claim 19, wherein said first substrate is a plastic substrate.

21. A passive matrix display device according to claim 19, wherein said second substrate is a glass substrate.

22. A passive matrix display device according to claim 19, wherein an encapsulant is provided in a portion surrounded by said first substrate, said first sealing material and said second substrate.

23. A passive matrix display device according to claim 22, wherein said encapsulant comprises resin.

24. A portable telephone having said passive matrix display device according to claim 19.

25. A passive matrix display device, comprising:
a plurality of EL element formed over a first surface of a first substrate;
a first sealing material surrounding said EL element, said first sealing material having an opening;
a first surface of a second substrate adhered to said first surface of said first substrate by said first sealing material;
an IC chip provided outside said first sealing material over said first surface of said first substrate;
a second sealing material covering said IC chip, said first sealing material and a portion of a second surface perpendicular to said first surface of said second substrate; and
a third sealing material covering said first sealing material and said opening,
wherein said first sealing material is sandwiched in between said first substrate and said second substrate,
wherein a driver circuit is formed in said IC chip, and
wherein said third sealing material covers a portion of a second surface perpendicular to said first surface of said first substrate and a portion of a second surface perpendicular to said first surface of said second substrate.

26. A passive matrix display device according to claim 25, wherein said first substrate is a plastic substrate.

27. A passive matrix display device according to claim 25, wherein said second substrate is a glass substrate.

28. A passive matrix display device according to claim 25, wherein an encapsulant is provided in a portion surrounded by said first substrate, said first sealing material and said second substrate.

29. A passive matrix display device according to claim 28, wherein said encapsulant comprises resin.

30. A portable telephone having said passive matrix display device according to claim 25.

31. A passive matrix display device, comprising:
a plurality of cathodes over a first surface of a first substrate;
a plurality of banks across said plurality of cathodes;
a plurality of light emitting layers across said plurality of cathodes, wherein said plurality of light emitting layers are separated by said plurality of banks;
a plurality of anodes over said plurality of light emitting layers, wherein said plurality of anodes are separated by said plurality of banks;
a first sealing material surrounding said plurality of cathodes, said plurality of banks, said plurality of light emitting layers and said plurality of anodes, said first sealing material having an opening;
a first surface of a second substrate adhered to said first surface of said first substrate by said first sealing material;
an IC chip provided outside said first sealing material over said first surface of said first substrate;
a second sealing material covering said IC chip, said first sealing material and a portion of a second surface perpendicular to said first surface of said second substrate; and
a third sealing material covering said first sealing material and said opening,
wherein said first sealing material is sandwiched in between said first surface of said first substrate and said first surface of said second substrate,
wherein a driver circuit is formed in said IC chip, and
wherein said third sealing material covers a portion of a second surface perpendicular to said first surface of said first substrate and a portion of a second surface perpendicular to said first surface of said second substrate.

32. A passive matrix display device according to claim 31, wherein said first substrate is a plastic substrate.

33. A passive matrix display device according to claim 31, wherein said second substrate is a glass substrate.

34. A passive matrix display device according to claim 31, wherein an encapsulant is provided in a portion surrounded by said first substrate, said first sealing material and said second substrate.

35. A passive matrix display device according to claim 34, wherein said encapsulant comprises resin.

36. A passive matrix display device according to claim 31, wherein lights generated by said plurality of light emitting layers are emitted to said second substrate.

* * * * *